United States Patent
Yang et al.

(10) Patent No.: US 11,439,010 B2
(45) Date of Patent: Sep. 6, 2022

(54) VIA PATTERN FOR FRAMEBUFFER INTERFACES

(71) Applicant: Nvidia Corporation, Santa Clara, CA (US)

(72) Inventors: Baal Yang, Santa Clara, CA (US); Daniel Lin, Santa Clara, CA (US); Sunil Sudhakaran, Santa Clara, CA (US)

(73) Assignee: Nvidia Corporation, Santa Clara, CA (US)

( * ) Notice: Subject to any disclaimer, the term of this patent is extended or adjusted under 35 U.S.C. 154(b) by 0 days.

(21) Appl. No.: 16/782,526

(22) Filed: Feb. 5, 2020

(65) Prior Publication Data
US 2021/0243895 A1 Aug. 5, 2021

(51) Int. Cl.
*H05K 1/11* (2006.01)
*H05K 1/14* (2006.01)
*H05K 1/02* (2006.01)

(52) U.S. Cl.
CPC ........... *H05K 1/116* (2013.01); *H05K 1/0298* (2013.01); *H05K 1/141* (2013.01); *H05K 2201/09227* (2013.01); *H05K 2201/10734* (2013.01)

(58) Field of Classification Search
CPC ...... H05K 1/116; H05K 1/0298; H05K 1/141; H05K 2201/10734; H05K 1/113; H05K 2201/09227; H05K 2201/09536; H05K 2201/09627
See application file for complete search history.

(56) References Cited

U.S. PATENT DOCUMENTS

| | | | | |
|---|---|---|---|---|
| 8,338,948 B2 * | 12/2012 | Weekly | ................... | H01L 23/50 257/738 |
| 8,698,305 B1 * | 4/2014 | Dewey | ................. | H05K 1/0295 257/734 |
| 10,021,784 B1 * | 7/2018 | Lee | ........................... | H05K 1/09 |
| 10,091,873 B1 * | 10/2018 | Xiong | ................. | H05K 1/0298 |
| 2003/0177638 A1 * | 9/2003 | Goergen | ............. | H05K 1/0243 29/846 |
| 2005/0160285 A1 * | 7/2005 | Evans | ...................... | G06F 21/84 713/194 |
| 2008/0036696 A1 * | 2/2008 | Slavenburg | ............ | G09G 3/003 345/8 |
| 2008/0245557 A1 * | 10/2008 | Bird | ....................... | H05K 1/113 174/262 |
| 2009/0014206 A1 * | 1/2009 | Motohashi | ............. | H05K 1/114 174/262 |
| 2009/0174072 A1 * | 7/2009 | Coates | ................... | H05K 1/112 174/262 |

(Continued)

*Primary Examiner* — Steven T Sawyer (57) ABSTRACT

This disclosure provides a multi-layered printed circuit board (PC) that has signal array region. The signal array region has a width and circumscribes a power core region and has signal vias connected to respective signal ball pads, and ground vias connected to respective ground ball pads within the signal array region that have an associated ball pad pitch. The PCB also has an inner current power layer. The signal and ground vias are arranged on the component layer in a pattern and extend into the inner current layer. The pattern forms current power paths across the width of the signal array region, such that the current power paths have a width that is at least about 50% as wide as the ball pad pitch.

30 Claims, 6 Drawing Sheets

(56) References Cited

U.S. PATENT DOCUMENTS

2015/0115430 A1* 4/2015 Yamamoto ........ H01L 23/49816
 174/262
2017/0316139 A1* 11/2017 Chun .................... G06F 30/398
2018/0033753 A1* 2/2018 Camarota ......... H01L 23/49827

* cited by examiner

VIA PATTERN FOR FRAMEBUFFER INTERFACES

TECHNICAL FIELD

This application is directed to a printed circuit board that may be used in a framebuffer interface for a graphic processor unit (GPU), for example, or in a variety of other applications.

BACKGROUND

Fueled by the ongoing growth of the graphics design and gaming markets and an ever-increasing demand for better 3D graphics, graphic processor unit(s) (GPU) have evolved on a dramatic scale for many computationally intensive applications. In addition to rendering highly realistic and immersive 3D graphics, GPUs also accelerate content creation workflows, high performance computing (HPC) and datacenter applications, and numerous artificial intelligence systems and applications. To achieve this high level of performance, GPU architecture has constantly evolved to a device state that has significantly increased data rates. As data rates continually increase in these high-performance devices, problems with crosstalk have, likewise, risen.

SUMMARY

One aspect of this disclosure provides a multi-layered printed circuit board (PC), comprising a component layer having a signal array region located thereon. The signal array region has a width and circumscribes a power core region. The signal array region has signal vias connected to respective signal ball pads, and ground vias connected to respective ground ball pads within the signal array region. The signal and ground ball pads have a ball pad pitch associated therewith. This embodiment further comprises an inner current power layer. The signal and ground vias are arranged on the component layer in a pattern and extend into the inner current layer. The pattern forms current power paths across the width of the signal array region, such that the current power paths have a width that is at least about 50% as wide as the ball pad pitch.

Another aspect of this disclosure provides a graphics card, comprising a PCB. The PCB comprises component layer that has a signal array region located thereon. The signal array region has a width and circumscribes a power core region and has signal vias connected to a respective signal ball pad and ground vias connected to a respective ground ball pad within the signal array region. The signal and ground ball pads have a ball pad pitch associated therewith. The graphics card further comprises an inner current power layer. The signal and ground vias are arranged on the component layer in a pattern and extend into the inner current layer. The pattern forms current power paths across the width of the signal array region, such that the current power paths have a width that is at least about 50% as wide as the ball pad pitch. The graphics card further comprises a graphics processor unit (GPU) located on and electrically connected to the printed circuit board and memory that is located on the printed circuit board and electrically connected to the GPU.

Another embodiment provides a method of fabricating a PCB. The method comprises forming signal and ground vias on a component layer of a PCB in a signal array region and in a signal via pattern and a ground via pattern. The signal array region has a width and circumscribing a power core region. The signal and ground vias extend at least into a current power level located within an inner level of the PCB and are arranged on the component layer in a pattern. The pattern forms current power paths across the width of the signal array region, such that the current power paths have a width that is at least about 50% as wide as the ball pad pitch. The method further comprises forming signal ball pads and ground ball pads on the outer layer and within the signal array region, the signal and ground ball pads forming a ball pad pitch, and electrically connecting each signal via to at least one signal ball pad and each ground via to at least one ground ball pad with a conductive trace.

BRIEF DESCRIPTION

Reference is now made to the following descriptions taken in conjunction with the accompanying drawings, in which.

DETAILED DESCRIPTION

The present disclosure provides a printed circuit board (PCB) that reduces crosstalk that can occur in high data rate electronic devices, such as those present in graphic processor units (GPUs). As data rate and performance levels have risen, along with attendant power requirements, the number of signal vias has also increased. This increase in the number of signal vias has increased crosstalk and has caused coplanar crosstalk between the signal lines to increase, as well. Increasing the number of ground vias helps reduce crosstalk. However, the increased number of signal vias and ground vias that extend into lower power level(s) have presented new design challenges, due to the need to keep the current power paths at high power performance levels.

To address these design challenges, this disclosure provides embodiments of a PCB that that has a component layer and a signal array region located thereon that has signal and ground vias respectively connected to ball pads. The ball pads are located on the PCB based on a desired spacing or ball pad pitch. These embodiments further include an inner current power layer where the signal and ground vias are arranged on the outer layer in a pattern and extend into the underlying inner current power level. The signal and ground via patterns on the component layer form current power paths across the inner current power layer that extend along the width of the signal array region, such that the current power paths have a width that is at least about 50% ($\pm 1.0$) as wide as the ball pad pitch on the component layer. Also, as described below, one embodiment of this disclosure provides the signal vias and ground vias respectively arranged along signal diagonal paths and ground via diagonal paths. These diagonal paths intersect to form, generally, "X" patterns of signal vias and ground vias. This pattern provides 4 ground vias located around each signal via that results in a ground via to signal via ratio of about 4:1, which as shown to reduce via crosstalk among data signals when compared to previous board designs. Additionally, the VDD channels' or power current path's performance is maintained or improved even though the ground via density has been increased on the component layer. The wide current power paths within the signal array region provide the power necessary required to drive high-performance devices at the high data rates, while the increased ground via density reduces crosstalk associated with the signal vias.

Figure 1:
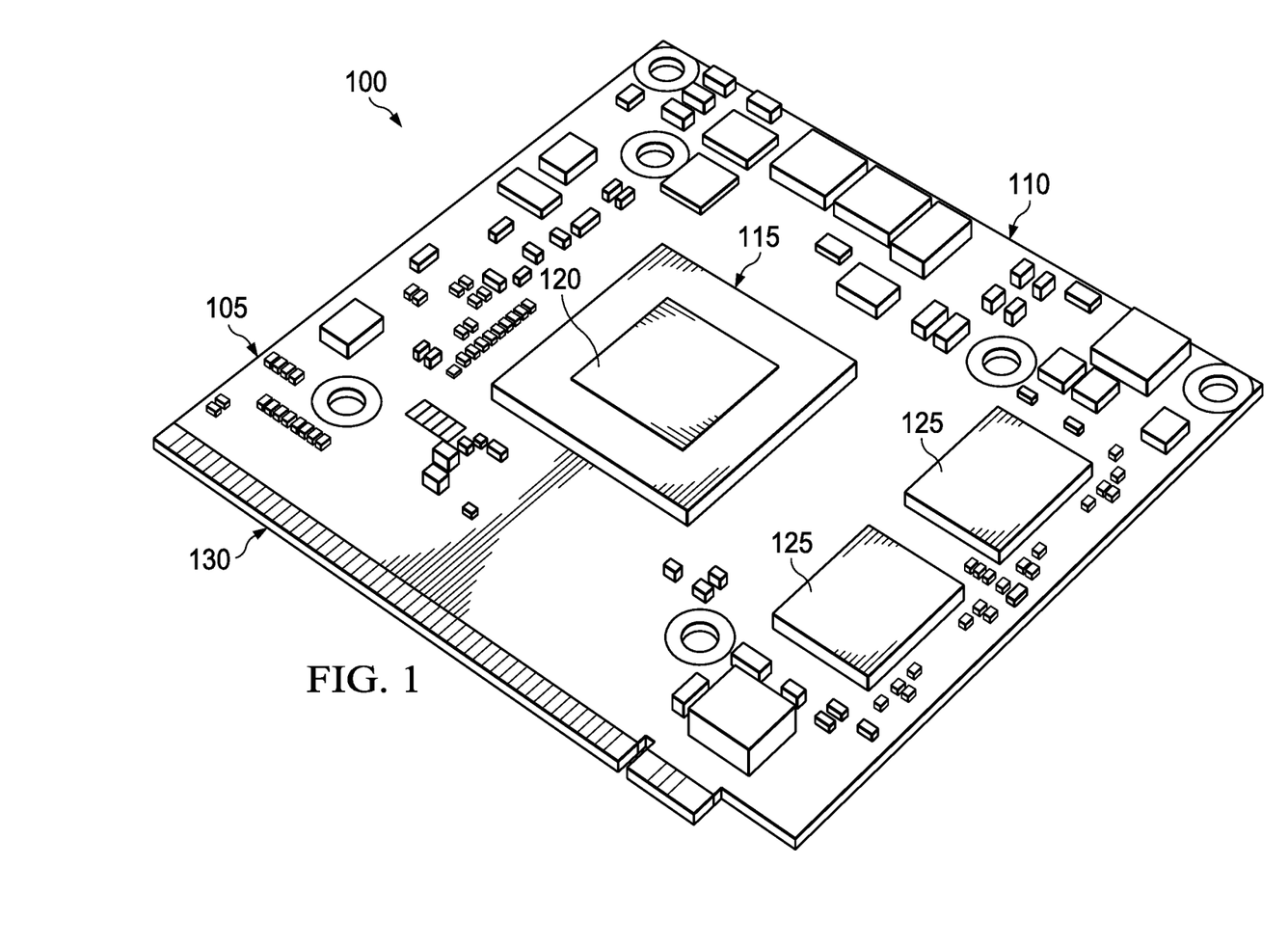
FIG. 1 is a perspective view of a graphic processor and associated memory located on a PCB as provided by the embodiments of this disclosure.

FIG. 1 illustrates an example of an electronics device 100 in which a multi-layered PCB 105, as provided by this disclosure, may be used. In this embodiment, the electronics device 100 is a graphics card 110, that includes a GPU 115. The GPU 115 may be of any known design or configuration. For example, the GPU 115 will have a processor core 120 and memory 125, to name just a few components, that are electrically connected through the layers and vias of the PCB 105. The PCB 105 will also include an electrical connector 130, such as plated finger connectors, as shown, or some other type of known electrical connector, such as a pin connector. As seen in the illustrated embodiment, the processor core 120 and memory 125, for example, are each contained within a known packaging material. The processor core 120 may be a multi-core processor capable of rendering high resolution images useful in many present-day applications, such as gaming stations, graphics design software used in the entertainment and construction or design industries, or the automobile industry. However, it should be understood that the electronics device 100 may be implemented in any number of electronic devices where a PCB board is required. The memory 125 may be any known type of memory, such as high-performance DRAM chips.

Figure 2:
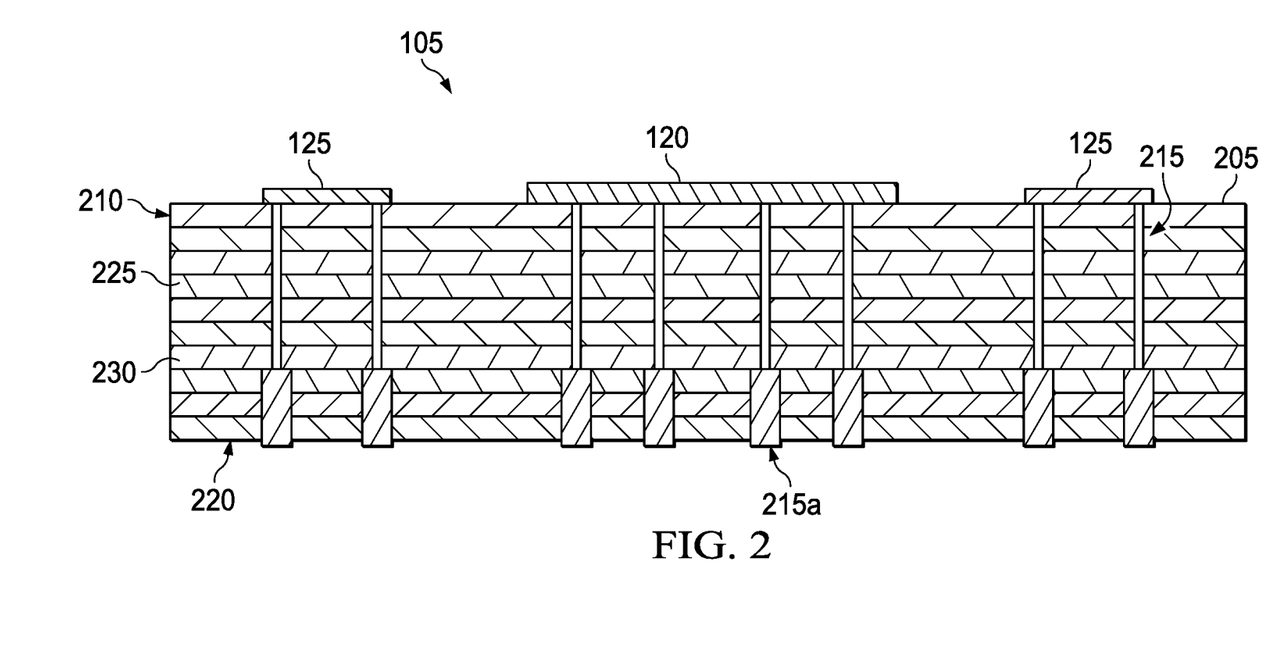
FIG. 2 is a general, sectional view of a PCB, as provided by this disclosure.

FIG. 2 illustrates a simplified schematic cross section of one embodiment of the PCB 105 with the processor core 120 and memory 125 being located on a component layer 205 of the PCB 105, which is the layer on which electrical components are connected. This is for illustrative purposes only, and those skilled in the art understand that many other components, such as resistors, inductors or capacitors may also be present on the PCB 105. In certain embodiments, the component layer 205 is the outermost layer of the PCB 105 onto which electrical components are reflowed. In the illustrated embodiment, the PCB 105 is comprised of multiple layers 210 that have conductive traces located thereon that are connected by vias 215 that extend through the multiple layers 210 of the PCB 105. In some designs, the vias 215 may include a backdrill via 215a that extends from the underside 220 of the PCB 105 to an inner level of the PCB 105 per design requirements. The PCB 105 may be constructed with known materials and fabricated using known fabrication processes. For example, the conductive traces (not shown) may be comprised of copper formed by known lithographic and etching processes. Though the vias 215 are shown as extending vertically through the multiple layers 210, in other embodiments, the vias 215 may have an offset pattern as they extend through the PCB 105 to interconnect inner layers per design requirements. The number of layers present in the PCB 105 may vary depending on design. For example, the PCB 105 may have 7 or more or less layers, depending on the complexity of the design. A signal layer 225 may be located on an inner level layer of the PCB 105 and under the component layer 205. An inner current power layer 230 is also located under the component layer 205 and may be positioned under the signal layer 225. The inner current power layer 230 supplies power to the components located on the PCB 105 and other components of the electronics device 100. The vias 215 extend from the component layer 205, through the multiple layers 210 of the PCB 105 and to the underside 220 of the PCB 105. The vias 215 connect to the conductive traces and provide electrical connection between the various levels and the electrical components on the PCB 105.

Figure 3:
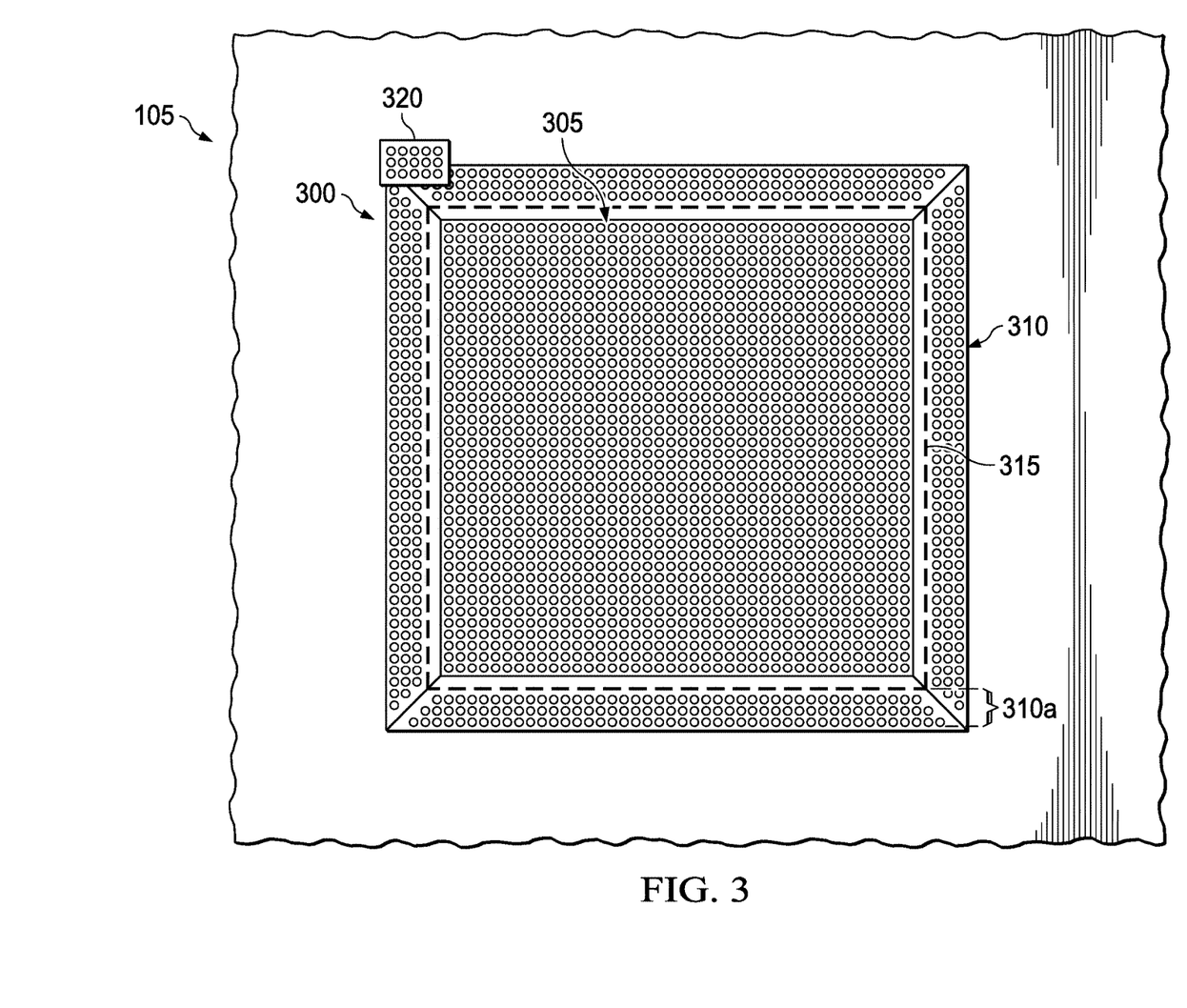
FIG. 3 is a schematic view of a component layer of an embodiment of the PCB of FIG. 2 illustrating a signal array in which the signal vias and ground vias are located, as provided by this disclosure.

FIG. 3 illustrates a general representation of one embodiment of a via layout 300 for a power core region 305 and a signal array region 310, for example, a framebuffer signal array region, that are located on the PCB 105, as provided by this disclosure, and it should be understood that the via layout 300 may lack the uniformity as shown in the general representation of FIG. 3. As known, a framebuffer signal is a portion of a graphics DDR DRAM which is a type of dynamic random-access memory (DRAM) designed for graphics processing units. The framebuffer signal comprises data, clock, and command signals that interface between the GPU and DRAM. A frame buffer signal is the bi-directional signal that transmits between GPU and DRAM.

The signal array region 310 has a width 310a, which will depend on the number of signal and ground vias necessary to meet design requirements. In some embodiments, the width 310a may extend up to the power core region 305. However, in yet other embodiments, the width 310a extends up to a non-framebuffer signal region 315, such as a differential signal region, as generally indicated by the dashed line. In such embodiments, the non-framebuffer signal region 315 extends from the signal array region 310 to the power core region 305. The width of the non-framebuffer signal region 315 will also depend on the number of non-framebuffer signals that are required by design parameters. There may be one or more such non-framebuffer regions that overlap a portion of the signal array region 310, such as the non-framebuffer signal region 320. In such embodiment, these non-framebuffer signal regions 315, 320 do not form a part of the signal array region 310. As seen in FIG. 3, the signal array region 310 circumscribes the power core region 305, which may be of different geometric shapes. As described in more detail below, the signal array region 310 has signal vias connected to a respective signal ball pad and ground vias connected to a respective ground ball pad within the signal array region 310 that have an associated ball pad pitch or separation.

Figure 4:
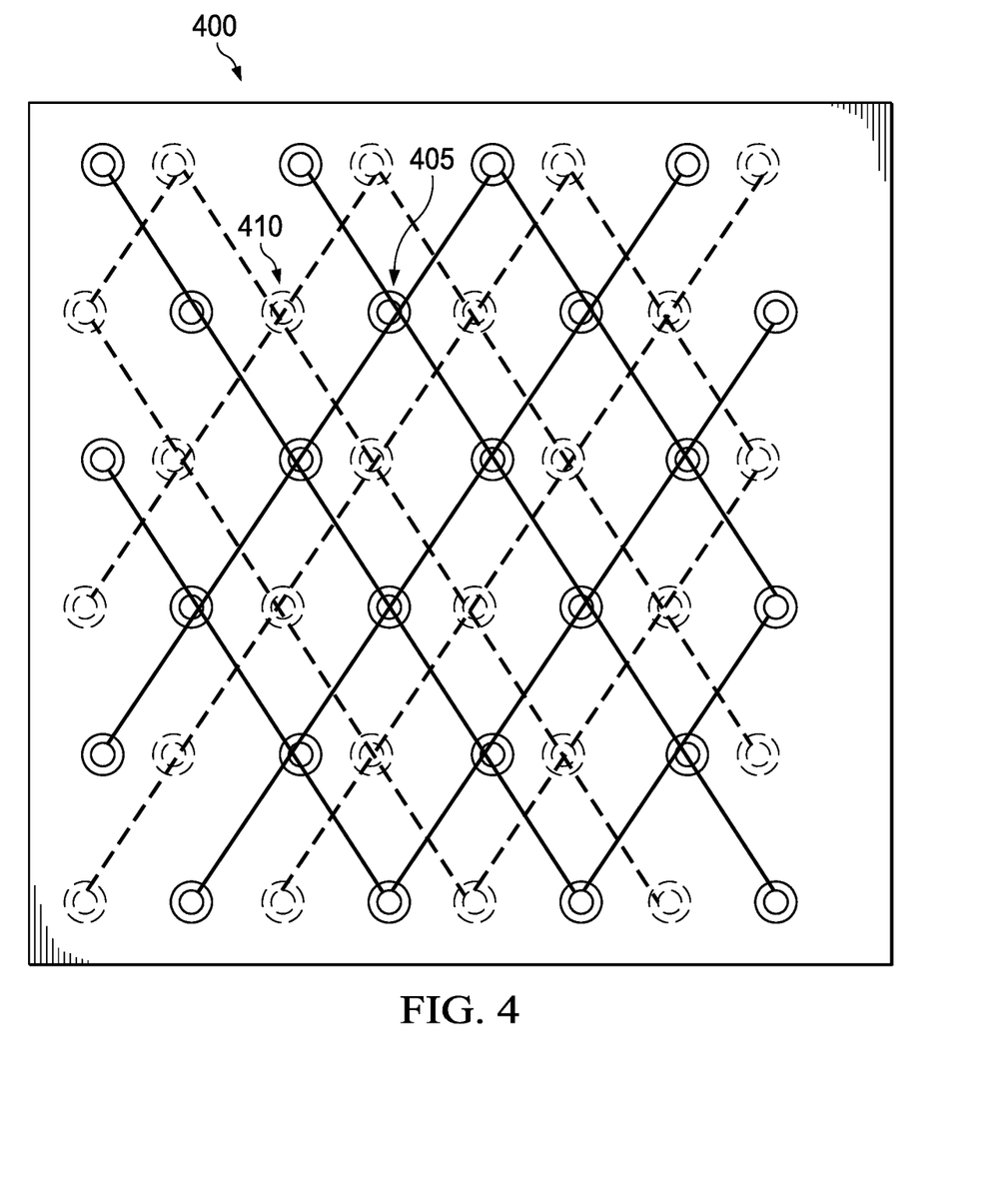
FIG. 4 is a general view of the top layer of a PCB of an embodiment where only the ground vias and signal vias layouts are shown.

FIG. 4 illustrates one embodiment of a partial top view of the component level of a multi-layered PCB 400, as previously described. For clarity, in this view, only the signal vias 405 (solid lines) and ground vias 410 (dashed lines) are shown, and it should be noted that the illustrated signal vias 405 and ground vias 410 are located within the signal array as described above. However, unlike other known PCB designs, in one embodiment, the signal vias 405 and ground vias 410 are generally arranged in columns and rows, within design tolerances, such that the signal vias 405 and ground vias 410 extend along alternating diagonal lines that intersect to form "X" patterns of signal vias 405 and "X" patterns of ground vias 410, as generally shown. In some embodiments, the centers of the signal vias 405 and the ground vias 410 will lie on their respective diagonal lines. However, in other the signal vias 405 and the ground vias will be arranged along their respective diagonal line, where at least a portion of the via will align with its respective diagonal line. These patterns provide more ground vias than former designs, which reduces crosstalk associated with the increased number of signal lines necessary to provide high data rate performance. In one embodiment, each signal via 405 has a ground via 410 located on opposing positions about the signal via 405, as generally shown in FIG. 4. In one aspect of this embodiment, a ratio of the ground vias 410 to the signal vias 405 is 4:1, and in another aspect of this embodiment, the ratio of ground vias 410 to signal vias 405 is 3:1. With this pattern, it has been shown that integrated crosstalk noise (ICN) among data signals has been reduced to about 1.39 millivolts, which is about a 60% reduction when compared to previous board designs. Also, the power delivery of the PCB's inner current power level is improved because of the signal and ground via patterns as provided by the embodiments of this disclosure. Thus, the embodiments of this disclosure provide the advantage of via distance flexibility and ground via proximity, while maintaining or even improving the power delivery of the device.

Figure 5:
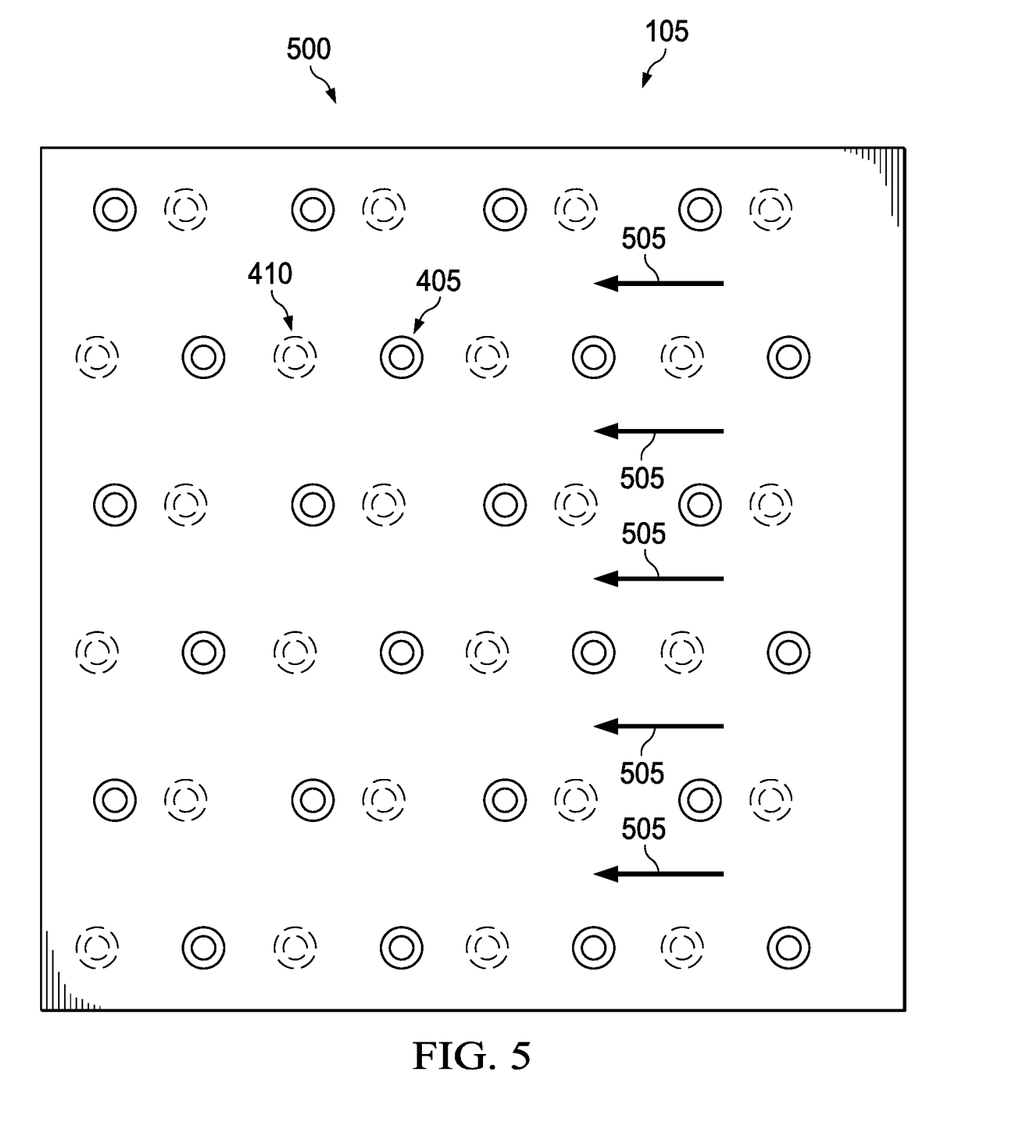
FIG. 5 is a general view of the inner current layer of the PCB of the embodiment of FIG. 4 illustrating the signal vias and ground via patterns as those located on the component layer.

FIG. 5 illustrates an embodiment of an inner current power layer 500, as generally discussed above. As discussed above, the signal vias 405 (shown in solid lines) and ground vias 410 (shown in dashed lines), are routed through the layers 210 of the PCB 105 from the component layer 205 and at least into the inner current power layer 500 to form a current power signal and ground via pattern on the inner current power layer 500 that is the same as the signal vias 405 and ground vias 410 pattern of the component layer 205. The signal and ground vias 405, 410 are arranged on the component layer 205 in a pattern and extend into the inner current layer 500. The pattern of the vias on the component layer 205 forms current power paths 505 across the width of the signal array region, such that the current power paths 505 have a width that is at least about 50% (±1%) as wide as the ball pad pitch on the component layer. As discussed below, in one embodiment, the ball pad pitch ranges from about 0.65 mm (±0.01 mm) to about 1.0 mm (±0.05 mm). Additionally, in one embodiment, the inner current power paths 505 extend along the width 310a of the signal array region 310 and to the power core region 305 (FIG. 3), in some embodiments. In another embodiment, the current power paths 505 have a width that is at least about 75% as wide as the ball pad pitch of the component layer 205. This particular embodiment provides a broad conductive path, even though the number of ground vias on the component layer 205 is greater than that of typical PCB board designs.

Figure 6A:
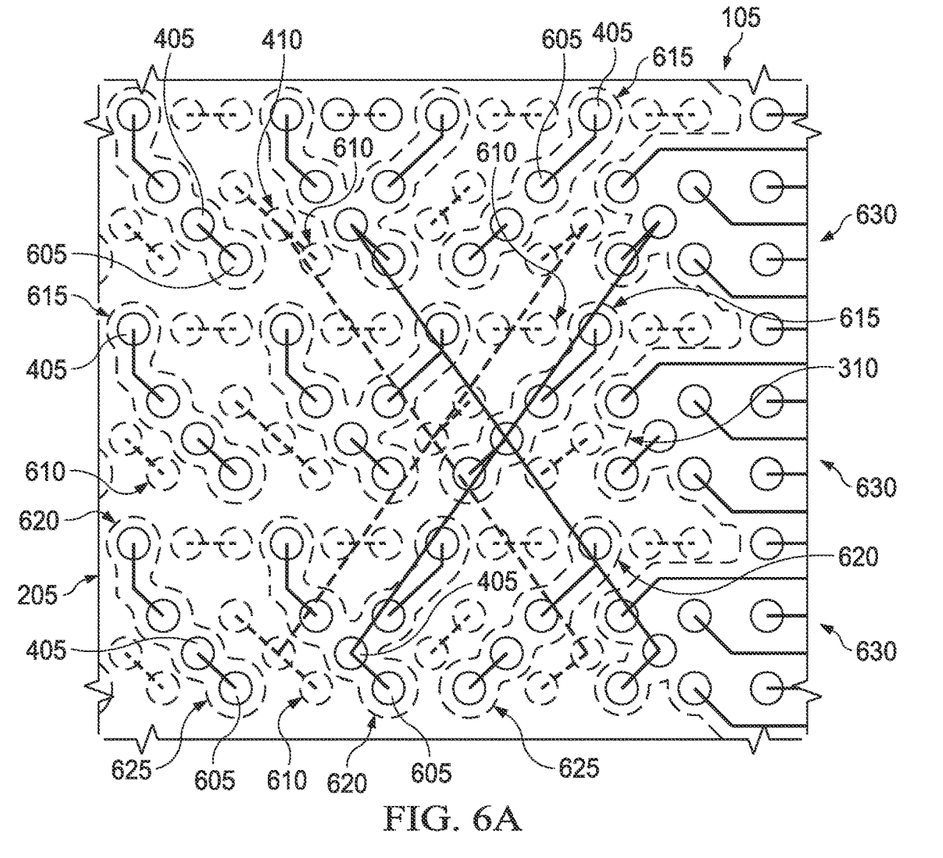
FIGS. 6A-6B is a schematic view of a component level of the PCB of the embodiment illustrated in FIG. 5, including the ball pad layout.
Figure 6B:
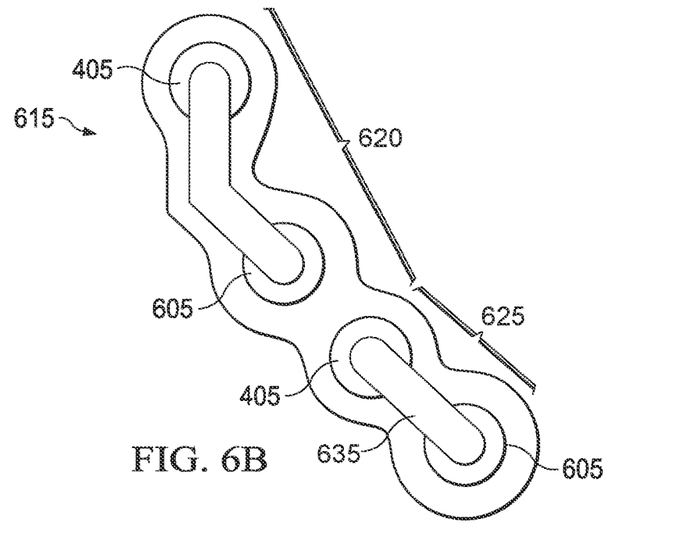

FIGS. 6A-6B illustrates a partial top view of one embodiment of the component layer 205 of the PCB 105, illustrating not only the previously described signal and ground vias 405, 410, but also illustrating signal ball pads 605 and ground ball pads 610 to which the signal and ground vias are electrically connected. As discussed above, in one embodiment, the signal via ball pads 605 and ground via ball pads 610 are laid out on the surface of the component layer 205 and have a ball pad pitch that ranges from about 0.60 mm (±0.01 mm) to about 1.0 mm (±0.05 mm). One aspect of this embodiment includes microstrips, 615, only a few of which are designated to maintain clarity of the illustration. In one aspect of this embodiment, the signal and ground vias 405, 410 are arranged in alternating rows and columns of signal vias and ground vias within the signal array 310, and the first and second microstrips 620, 625 form an altering pattern along the rows and columns.

FIG. 6A further illustrates an electrical connection region 630 that lies outside of the signal array region 310. As mentioned above, the edges of the signal array region 310 are not necessarily uniform but may be a jagged edge that forms the boundary between the framebuffer array region 310 and the electrical connection region 630, as generally shown in FIG. 6.

FIG. 6B illustrates an enlarge view of the microstrips 615, as briefly mentioned above. The microstrips 615 are formed by a portion of the signal vias 405, and as such, includes the signal via 405 and a ball pad 605 that is connected by a trace 635. Some of the signal vias 405 form first microstrips 620 that have a length greater than 500 microns and another portion of the signal vias 405 form second microstrips 625 that have a length of 500 microns or less. In some embodiments, the first microstrips 620 may have a bent or "dog bone" configuration, while the second microstrips 625 are relatively straight, as generally shown in FIG. 6B. The microstrips 615 provide greater flexibility in achieving the desired degree of ground via density on the component layer 205 and general optimization of the PCB 105, and in such embodiments, the microstrips 615 can be designed to along the diagonal or "X" patterns, as described above, an as partially shown in FIG. 6A. For example, the length of the microstrips 615 and degree of bend between the via and ball pad can be adjusted to cause them to lie along the desired diagonal line.

Those skilled in the art to which this application relates will appreciate that other and further additions, deletions, substitutions and modifications may be made to the described embodiments.

What is claimed is:

1. A multi-layered printed circuit board (PCB), comprising:
a component layer having a signal array region located thereon, the signal array region having a width and circumscribing a power core region, the signal array region having signal vias connected to a respective signal ball pad and ground vias connected to a respective ground ball pad within the signal array region, the signal and ground ball pads forming a ball pad pitch, wherein a portion of the signal vias form first microstrips and another portion of the signal vias form second microstrips and a length of the first microstrips is different than a length of the second microstrips; and
an inner current power layer, wherein the signal and ground vias are arranged on the component layer in a pattern and extend into the inner current power layer, the pattern forming current power paths across the width of the signal array region, such that the current power paths have a width that is at least 50% as wide as the ball pad pitch.

2. The multi-layered PCB of claim 1, wherein current power paths have a width that is at least 75% as wide as the ball pitch of the outer layer.

3. The multi-layered PCB of claim 1, wherein the signal vias are located along signal diagonal paths within the signal array region and the ground vias are located along ground diagonal paths within the width of the signal array region.

4. The multi-layered PCB of claim 1, wherein the ball pad pitch ranges from 0.65 mm to 1.0 mm.

5. The multi-layered PCB of claim 1, wherein each signal via has a ground via located on opposing sides thereof.

6. The multi-layered PCB of claim 1, wherein the signal array region is a framebuffer signal array region.

7. The multi-layered PCB of claim 1, wherein the length of the first microstrips is greater than the length of the second microstrips.

8. The multi-layered PCB of claim 3, wherein the signal diagonal paths intersect, and the ground diagonal path intersect to form respective "X" patterns of the signal vias and the ground vias within the signal array region.

9. The multi-layered PCB of claim 5, wherein a ratio of ground vias to signal vias is 4:1.

10. The multi-layered PCB of claim 7, wherein the first microstrips have a length of greater than 500 microns and the second microstrips have a length of 500 microns or less.

11. The multi-layered PCB of claim 10, wherein the signal and ground vias are arranged in alternating rows and columns of signal vias and ground vias within the signal array, and the first and second microstrips form an altering pattern along the rows and columns.

12. An electronics device graphics card, comprising:
a printed circuitry board comprising:
    a component layer having a signal array region located thereon, the signal array region having a width and circumscribing a power core region, the signal array region having signal vias connected to a respective signal ball pad and ground vias connected to a respective ground ball pad within the signal array region, the signal and ground ball pads forming a ball pad pitch, wherein a portion of the signal vias form first microstrips and another portion of the signal vias form second microstrips and a length of the first microstrips is different than a length of the second microstrips; and
    an inner current power layer, wherein the signal and ground vias are arranged on the component layer in a pattern and extend into the inner current layer, the pattern forming current power paths across the width of the signal array region, such that the current power paths have a width that is at least 50% as wide as the ball pad pitch;
a graphics processor unit (GPU) located on and electrically connected to the printed circuit board; and
memory located on the printed circuit board and electrically connected to the GPU.

13. The electronics device graphics card of claim 12, wherein the GPU has an integrated crosstalk noise value of 5.5 mV or less.

14. The electronics device graphics card of claim 12, wherein current power paths have a width that is at least 75% as wide as the ball pitch of the outer layer.

15. The electronics device graphics card of claim 12, wherein the signal vias are located along signal diagonal paths within the signal array region and the ground vias are located along ground diagonal paths within the width of the signal array region.

16. The electronics device graphics card of claim 12, wherein the ball pad pitch ranges from 0.65 mm to 1.0 mm.

17. The electronics device graphics card of claim 12, wherein each signal via has a ground via located on opposing sides thereof such that a ratio of ground vias to signal vias is 4:1.

18. The electronics device graphics card of claim 12, wherein the signal array region is separated from the power core region by a differential signal region.

19. The electronics device graphics card of claim 12, wherein the length of the first microstrips is greater than the length of the second microstrips.

20. The electronics device graphics card of claim 15, wherein the signal diagonal paths intersect, and the ground diagonal path intersect to form respective "X" patterns of the signal vias and the ground vias within the signal array region.

21. The electronics device graphics card of claim 19, wherein the first microstrips have a length of greater than 500 microns and the second microstrips have a length of 500 microns or less.

22. The electronics device graphics card of claim 21, wherein the signal and ground vias are arranged in alternating rows and columns of signal vias and ground vias within the signal array, and the first and second microstrips form an altering pattern along the rows and columns.

23. A method of fabricating a printed circuit board (PCB), comprising:
    forming signal and ground vias on a component layer of the PCB in a signal array region and in a signal via pattern and a ground via pattern, the signal array region having a width and circumscribing a power core region, wherein the signal and ground vias are arranged on the component layer in a pattern and extend into the inner current layer, the pattern forming current power paths across the width of the signal array region, such that the current power paths have a width that is at least 50% as wide as the ball pad pitch, and wherein a portion of the signal vias form first microstrips and another portion of the signal vias form second microstrips and a length of the first microstrips is different than a length of the second microstrips;
    forming signal ball pads and ground ball pads on the outer layer and within the signal array region, the signal and ground ball pads forming a ball pad pitch; and
    electrically connecting each signal via to at least one signal ball pad and each ground via to at least one ground ball pad with a conductive trace.

24. The method of claim 23, wherein current power paths have a width that is at least 75% as wide as the ball pitch of the outer layer.

25. The method of claim 23, wherein the signal vias are located along signal diagonal paths within the signal array region and the ground vias are located along ground diagonal paths within the width of the signal array region.

26. The method of claim 23, wherein the ball pad pitch ranges from 0.65 mm to 1.0 mm and the PCB has a ratio of ground vias to signal vias of 4:1.

27. The multi-layered PCB of claim 1, wherein the signal array region is separated from the power core region by a differential signal region.

28. The method of claim 23, wherein the length of the first microstrips is greater than the length of the second microstrip.

29. The method of claim 25, wherein the signal diagonal paths intersect, and the ground diagonal path intersect to form respective "X" patterns of the signal vias and the ground vias within the signal array region.

30. The method of claim 28, wherein the first microstrips have a length of greater than 500 microns and the second microstrips have a length of 500 microns or less.

* * * * *